United States Patent
Wyatt

(10) Patent No.: US 7,903,016 B1
(45) Date of Patent: Mar. 8, 2011

(54) HIGH POWER AND HIGH FREQUENCY GALLIUM NITRIDE BASED DIGITAL TO ANALOG CONVERTER FOR DIRECT DIGITAL RADIO FREQUENCY POWER WAVEFORM SYNTHESIS

(75) Inventor: Michael A. Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 36 days.

(21) Appl. No.: 12/539,929

(22) Filed: Aug. 12, 2009

(51) Int. Cl.
 *H03M 1/80* (2006.01)
(52) U.S. Cl. .......... 341/153; 341/135; 341/136; 341/144
(58) Field of Classification Search .................. 341/135, 341/136, 144, 153
See application file for complete search history.

(56) References Cited

U.S. PATENT DOCUMENTS

| | | | | |
|---|---|---|---|---|
| 3,987,473 A * | 10/1976 | Kondo | ........................... | 396/464 |
| 4,292,625 A * | 9/1981 | Schoeff | ........................ | 341/145 |
| 4,510,486 A * | 4/1985 | Nagano | ......................... | 341/134 |
| 5,835,039 A * | 11/1998 | Giacomini | ............. | 160/178.1 R |
| 5,870,049 A * | 2/1999 | Huang et al. | .................... | 341/144 |
| 5,905,454 A * | 5/1999 | Lenz et al. | ..................... | 341/144 |
| 6,937,180 B1 * | 8/2005 | Muratov et al. | ............... | 341/154 |
| 7,026,971 B2 * | 4/2006 | Horsky et al. | ................. | 341/145 |
| 7,042,379 B2 * | 5/2006 | Choe | .............................. | 341/144 |
| 7,068,201 B1 * | 6/2006 | Chou | ............................ | 341/144 |
| 7,312,740 B2 * | 12/2007 | Chou | ............................ | 341/145 |
| 7,504,976 B1 | 3/2009 | Pellon | | |
| 7,515,085 B2 * | 4/2009 | Bore et al. | ..................... | 341/159 |
| 2001/0052868 A1 * | 12/2001 | Masuda | ........................ | 341/153 |

* cited by examiner

Primary Examiner — Linh V Nguyen
(74) Attorney, Agent, or Firm — RatnerPrestia

(57) ABSTRACT

A high power digital to analog converter (DAC) includes (a) an array of n bipolar transistors arranged in a binary sequence, (b) a depletion mode FET and (c) an array of n switches. The collector terminals of each bipolar transistor in the array are tied together. Furthermore, the depletion mode FET includes a source terminal which is directly connected to the collector terminals of each bipolar transistor. The FET also includes a gate terminal connected to a ground potential, and a drain terminal. Each bipolar transistor is sized to be a factor larger than its preceding transistor in the array of n bipolar transistors, for example, twice as large. The array of n switches is controlled by a digital word of n bits. Each of the n switches selectively activates a respective bipolar transistor in the array of n bipolar transistors. As the n switches are selectively activated, the array of n bipolar transistors provides n binary weighted collector currents in the source terminal of the FET. The n collector currents are equal to a sum of the binary weighted collector currents. The drain terminal of the FET provides the same sum of the binary weighted collector currents.

20 Claims, 3 Drawing Sheets

HIGH POWER AND HIGH FREQUENCY GALLIUM NITRIDE BASED DIGITAL TO ANALOG CONVERTER FOR DIRECT DIGITAL RADIO FREQUENCY POWER WAVEFORM SYNTHESIS

FIELD OF INVENTION

The present invention relates to a high power, high frequency digital-to-analog converter (DAC) for direct digital-to-antenna (DDA) radio frequency (RF) power waveform synthesis. The present invention advantageously eliminates an entire RF signal generation and power amplification chain in moderate power applications.

BACKGROUND OF THE INVENTION

A power amplifier providing greater than ten (10) Watts of power requires a relatively high primary voltage to enable an efficient radio frequency transmission. On the other hand, transistors included in a circuit, which provide a digital waveform for modulating an RF signal for transmission, require low operating voltages, such as one (1) to two (2) volts. These transistors are typically susceptible to a low voltage breakdown and, generally, need protection from high voltages that may be reflected from the output side of a power amplifier. Impedance mismatches between the output side of a power amplifier and its load (such as an antenna) may produce a high voltage standing wave ratio (VSWR) that forms a voltage likely to exceed the safe operating margins of the transistors generating the digital waveform.

Due to operating voltage differences, separate circuits are typically required between a circuit used for generation of signal waveforms and a circuit used for generation of RF power. Hence, the need for separate digital waveform generators and RF power amplifiers.

Conventional circuits using complimentary metal-oxide-semiconductor (CMOS) fabrication techniques cannot synthesize a digital waveform directly at an antenna for transmission at high RF power levels. The elimination of the entire RF signal generation and power amplification chain is not possible with conventional circuits. The present invention includes a composite device that may be used for direct synthesis of a digital waveform at an antenna, which eliminates the need for an RF signal generator and power amplifier chain.

SUMMARY OF THE INVENTION

To meet this and other needs, and in view of its purposes, the present invention provides a high power digital to analog converter. The device includes an array of n transistors arranged in a binary sequence, in which any transistor in the sequence is twice as large as its preceding transistor. The array of n transistors including respective collector terminals are tied together. Also included is a depletion mode field-effect transistor (FET) including a source terminal connected to the respective collector terminals, and a drain terminal for providing a drain current. The device includes an array of n switches for selectively activating the n transistors of the array, and selectively providing binary weighted collector currents in the respective collector terminals. The drain current is an approximate sum of the binary weighted collector currents. The depletion mode FET includes a gate terminal connected to a ground potential. The array of n transistors includes respective emitter terminals connected to the array of n switches for selectively connecting the respective emitter terminals to the ground potential.

The array of n switches are controlled by a digital word of n bits. The depletion mode FET may include a gallium nitride, high electron mobility transistor. The array of n switches may include an array of n-channel metal-oxide-semiconductor (NMOS) transistors. The array of n transistors may include an array of bipolar transistors or NMOS transistors. The array of n switches are controlled, respectively, by n bits. The drain current provides an analog signal corresponding to the n bits.

A load coupled to the drain terminal for transmitting the analog signal as an RF power output signal. The load is a matching transformer including a primary coil coupled to the drain terminal and a secondary coil coupled to an antenna. The high power digital to analog converter includes a processor for providing the n bits as a core waveform to the n switches. The array of n transistors includes respective base terminals tied together. The array of n transistors includes a reference transistor having a base terminal tied to the respective base terminals of the array of n transistors for establishing a reference current to amplitude modulate the drain current.

A direct digital to antenna (DDA) transmitter includes an array of n transistors having n collector terminals for providing respective n collector currents, wherein the n collector currents are arranged in a binary sequence of $I_0, I_1, I_2, \ldots I_{n-1}$. Also included is a depletion mode FET including a source terminal connected to the n collector terminals, and a drain terminal connected to a load for transmitting an analog signal. The array of n transistors are selectively activated by digital data to provide a selective binary sequence of $I_0, I_1, I_2, \ldots I_{n-1}$. The analog signal includes a value that is a predetermined constant value times an approximate sum of the selective binary sequence of $I_0, I_1, I_2, \ldots I_{n-1}$. The device includes an array of n switches for receiving n bits of the digital data and selectively activating at least a portion of the n transistors in the array.

The depletion mode FET includes a base terminal connected to a ground potential. The array of n transistors includes n emitter terminals coupled to the ground potential. An array of n switches are coupled between the n emitter terminals and the ground potential for selectively activating at least one of the n transistors in the array. The array of n transistors includes respective base terminals tied together. Also included is a reference transistor having a base terminal is tied to the respective n base terminals of the array of n transistors for establishing a reference current to amplitude modulate the analog signal.

The depletion mode FET may include a gallium nitride, high electron mobility transistor. The array of n switches may include an array of n NMOS transistors. The array of n transistors may include an array of bipolar transistors or NMOS transistors. The load coupled to the drain terminal may be a matching transformer including a primary coil coupled to the drain terminal and a secondary coil configured for coupling to an antenna. The load coupled to the drain terminal is configured for connection to a voltage supply. The array of n transistors have a breakdown voltage that is lower than a voltage provided by the voltage supply. The array of n transistors are coupled to another array of n switches for selectively providing the digital data.

It is understood that the foregoing general description and the following detailed description are exemplary, but not restrictive, of the invention.

BRIEF DESCRIPTION OF THE DRAWINGS

The foregoing summary, as well as the following detailed description of exemplary embodiments of the invention, will be better understood when read in conjunction with the appended drawings, which are incorporated herein and constitute part of this specification. For the purposes of illustrating the invention, there are shown in the drawings exemplary embodiments of the present invention. It will be understood, however, that the invention is not limited to the precise arrangements and instrumentalities shown. In the drawings, the same reference numerals are employed for designating the same elements throughout the several figures. In the drawings.

DETAILED DESCRIPTION OF THE INVENTION

The present invention includes a high power, high frequency digital-to-analog converter (DAC) for direct digital-to-antenna radio frequency (RF) power waveform synthesis. The present invention combines a depletion mode field-effect transistor (FET) with an array of n transistors. For example, the present invention combines a high power, high voltage gallium nitride transistor (GaN transistor) with a silicon germanium bipolar complimentary metal-oxide-semiconductor (CMOS) transistor (SiGe transistor) to form a composite device, referred to by the inventor as a "GaNsistor". This composite device leverages the GaN high standoff voltage and power with the intrinsic advantages of SiGe bipolar transistor processes.

As will be explained, the GaN transistor may be employed to provide a high power, high frequency digital-to-analog converter with sufficient waveform power and speed to invoke direct-digital-to-antenna waveform generation. This permits elimination of an entire RE signal generation and power amplification chain and advantageously provides a more digital friendly solution towards a true software defined radio transmitter.

Figure 1:
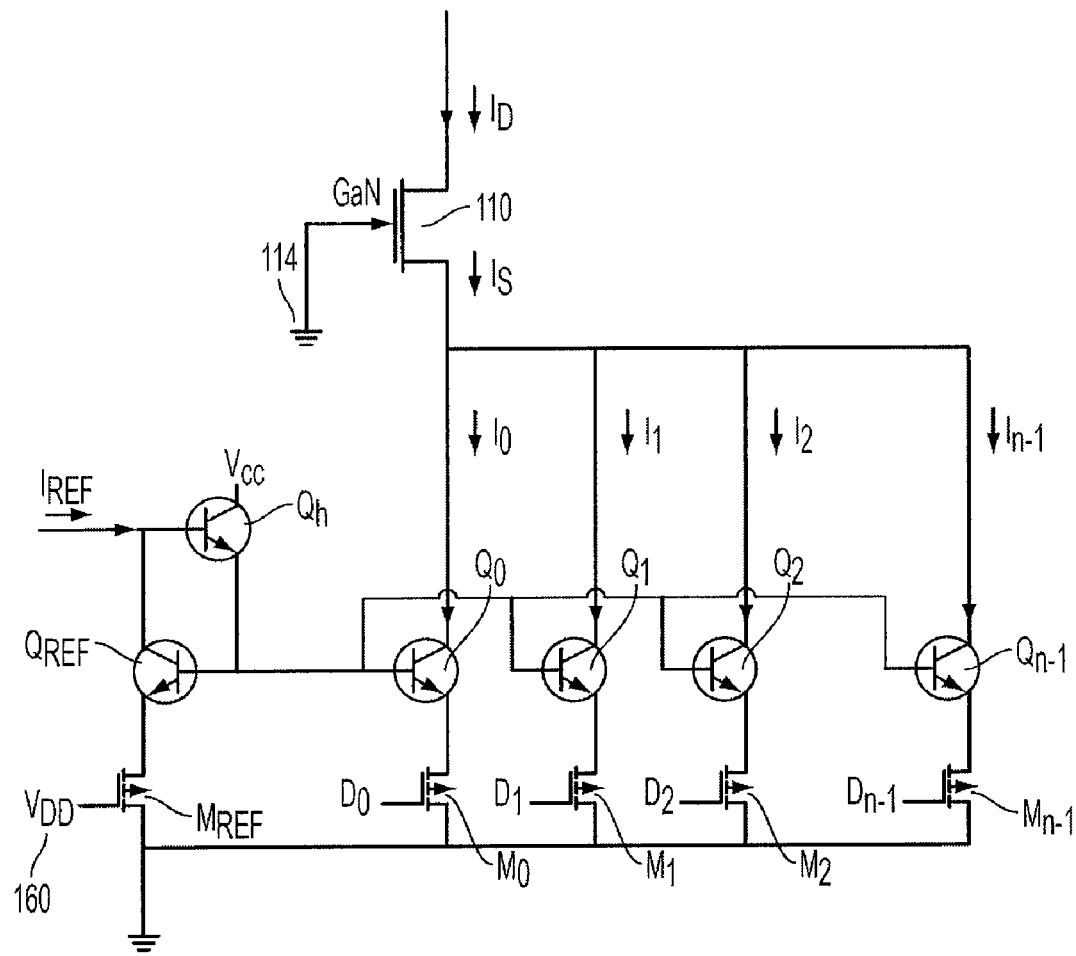
FIG. 1 is a schematic diagram depicting a composite device including a gallium nitride transistor and an array of n silicon germanium transistors which provide a high power, high frequency, n bit digital to analog converter, in accordance with an embodiment of the present invention.
Figure 1:
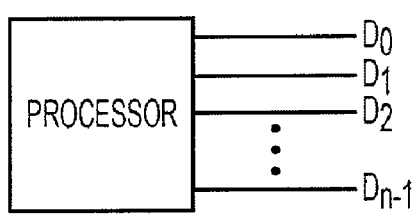

Referring to FIG. 1, a GaN transistor, designated as 110, is connected in a common gate configuration with its gate directly tied to a ground reference 114. In the present invention, the GaN transistor is a depletion mode device. Accordingly, its source is maintained at a positive voltage level with respect to its gate, in order to reduce the drain current $I_D$ of the GaN transistor from a normally on saturated state. Also shown is an array of n bipolar silicon or SiGe transistors, $Q_0$ through $Q_{n-1}$. The transistors $Q_0$ through $Q_{n-1}$ are connected together in parallel with each of their respective bases tied to a base of another transistor, designated as $Q_{REF}$ and an emitter of yet another transistor, designated as $Q_h$. It will be appreciated that the $Q_h$ and $Q_{REF}$ transistors serve as a beta-helper type current mirror, as will be explained later.

The collectors of transistors $Q_0$ through $Q_{n-1}$ are also connected together to the source of GaN transistor 110. Finally, the emitters of transistors $Q_0$ through $Q_{n-1}$ are connected to respective drain terminals of n NMOS transistors, designated as $M_0$ through $M_{n-1}$. As will be explained, the n NMOS transistors provide a switching mechanism for inputting a digital n-bit word, shown by bits $D_0, D_1, D_2, \ldots D_{n-1}$, into the array of n bipolar transistors.

Being a depletion mode device, the source of the GaN transistor is kept at a positive voltage level with respect to the gate of the GaN transistor. As the positive voltage level at the source increases, the drain current, $I_D$, is reduced. This provides a convenient bias voltage for the GaN transistor using the collectors of the SiGe bipolar transistors, $Q_0$ through $Q_{n-1}$. As shown, a current bias of $I_0+I_1+I_2, \ldots, +I_{n-1}$ is supplied to the source of the GaN transistor from the series of binary weighted SiGe bipolar transistors, which have their common bases tied to a beta helper type current mirror. These connections keep the SiGe transistors in a common base configuration with equal base and collector bias voltages. Furthermore, each emitter of the SiGe transistors is likewise connected to binary weighted NMOS switches, $M_0$ through $M_{n-1}$. The binary weighted NMOS switches, $M_0$ through $M_{n-1}$, are provided with digital control $D_0$ through $D_{n-1}$ at the gates of the NMOS switches.

A reference NMOS transistor, $M_{REF}$, is provided to the current bias reference SiGe transistor $Q_{REF}$ in order to compensate for the small voltage drop across NMOS transistors, $M_0$ through $M_{n-1}$, each having a finite resistance when turned on. The reference transistor, $Q_{REF}$, is always on, because the gate of the $M_{REF}$ transistor is tied to a logic supply voltage $V_{DD}$, shown designated as 160.

The NMOS switching transistors, $M_0$ through $M_{n-1}$ operate into the emitters of each binary weighted SiGe transistors, $Q_0$ through $Q_{n-1}$, and never see a drain voltage larger than the base to emitter voltage, $V_{BE}$, of any respective SiGe transistor, when a corresponding NMOS switching transistor is turned off. This allows the present invention to advantageously use the smallest geometry and fastest possible NMOS switching transistors.

As described above, each of the SiGe transistors, $Q_0$ through $Q_{n-1}$, is sized twice as large as a preceding SiGe transistor, such that the relative binary weight of each SiGe transistor may be calculated, for example, as follows:

$$Q_0 = 2^0 = 1$$

$$Q_1 = 2^1 = Q_0 * 2 = 2$$

$$Q_2 = 2^2 = Q_1 * 2 = 4$$

$$Q_3 = 2^3 = Q_2 * 2 = 8$$

$$Q_{n-1} = 2^{n-1} = Q_{n-2} * 2$$

Each binary weighted SiGe transistor $Q_0$ through $Q_{n-1}$ sinks a current equal to the reference current, $I_{REF}$, times its binary weight $2^{n-1}$, where n is the number of bits in a word. Because the SiGe transistors, $Q_0$ through $Q_{n-1}$, are connected in parallel, the individual binary weighted currents may be summed and sunk at the source of GaN transistor 110. Thus, the source current, $I_s$, of the GaN transistor is equal to $I_0+I_1+I_2+ \ldots +I_{n-1}$. Assuming that the drain current, $I_D$, is equal to the source current $I_S$, then $I_D$ is equal to $I_0+I_1+I_2+ \ldots +I_{n-1}$.

Furthermore, input logic bits $D_0$ to $D_{n-1}$ control the NMOS switches, $M_0$ through $M_{n-1}$, which in turn activate corresponding one or more of the $Q_0$ through $Q_{n-1}$ transistors. Thus, a binary weighted representative of the reference current $I_{REF}$ inputted to the source of GaN transistor 110 may be outputted at the drain of the GaN transistor. In one example, if input logic bits $D_0$ and $D_1$ are present, respectively, at the gates of NMOS switches $M_0$ and $M_1$, the $M_0$ and $M_1$ transistors are activated, thereby placing $I_0$ and $I_1$ at the source of GaN transistor 110. In turn, the drain of the GaN transistor has approximately the same drain current at its drain terminal.

In general, each one of the NMOS switches, $M_0$ through $M_{n-1}$, either turn on or off depending on the sequence of digital inputs $D_0$ through $D_{n-1}$. In turn, the array of n SiGe transistors, $Q_0$ through $Q_{n-1}$, provides a current $I_0$ through $I_{n-1}$, which may have a binary weighted value. Because the SiGe transistors are connected to the source of GaN transistor 110 and the gate of the GaN transistor is grounded at terminal 114, the current at the drain of the GaN transistor, $I_D$, may be calculated as follows:

$$I_D = I_{REF} * (I_0 + I_1 + I_2 + \ldots + I_{n-1})$$

where each of the source currents may have a positive or zero value depending on the value of the sequence of digital inputs $D_0$ through $D_{n-1}$.

Since GaN transistor 110 is in a common gate configuration, the source current, $I_S$, is supplied from the drain of the GaN transistor and, subsequently, from a much higher primary supply voltage. This enables a higher overall power from the GaN transistor since the drain current may be impressed across a larger load impedance, at a much higher voltage than any of the SiGe transistors, $Q_0$ through $Q_{n-1}$, is able to individually support. As described above, the digital input word, controlling the binary weighted current source, effectively multiplies the reference current $I_{REF}$ by the binary digital word.

Advantageously, with its unique connection of (1) a GaN transistor, operating in the depletion mode, and (2) an array of n SiGe transistors, operating as a binary weighted current source for the GaN transistor, including (3) a simple, minimum geometry circuit allowing current gating by n NMOS switches, which need only support a $V_{BE}$ low voltage junction, the present invention realizes a high speed, high power DAC suitable for direct RF waveform synthesis.

High speeds may be achieved because the GaN transistor and the SiGe transistors are operated in common gate/base configurations which yield high isolation and speed. The basic waveform signal may be operated in a current mode, which has a low impedance and thus high speed, until the waveform signal arrives at the drain of GaN transistor 110, where a higher impedance may be used to allow a much larger voltage swing and higher power.

In addition, the reverse isolation from the drain of the GaN transistor to the source of GaN transistor is very high, because of the common gate configuration of the GaN transistor. The source and drain of the GaN transistor become isolated from each other, because the gate of the GaN transistor is grounded at terminal 114. This effectively shunts reverse signals to ground terminal 114, before the signals are able to reach the source of the GaN transistor. Thus, the sensitive SiGe transistors, $Q_0$ through $Q_{n-1}$, and the sensitive NMOS transistors, $M_0$ through $M_{n-1}$, are protected from voltage surges on the drain of the GaN transistor. Such voltages surges may occur due to high voltage standing wave ratio (VSWR) conditions common in radio communication applications. Since GaN transistor 110 may intrinsically withstand very high drain voltages, it may be operated with high voltage swings to provide high power output. On the other hand, because the common gate configuration insulates the lower voltage circuits, such as the array of n SiGe transistors and the array of n NMOS switches, they may have low breakdown voltages and safely operate at low voltages (such as 1 to 2 volts, for example).

Figure 3:
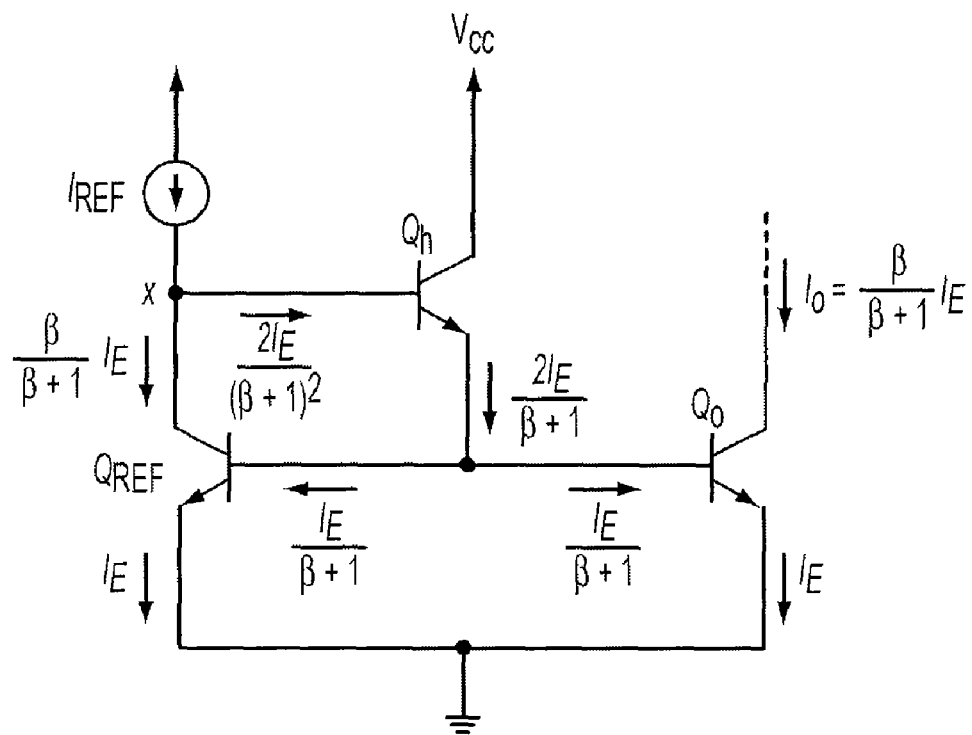
FIG. 3 is a schematic diagram of a portion of the elements shown in FIG. 2, where the portion includes a beta helper type current mirror.

It will be appreciated that the current $I_{REF}$ establishes the basic current at the emitter of each one of SiGe transistors and serves as a scaling factor for the core waveform represented by the n-bit word, which may be supplied from a processor (not shown). The combined $Q_{REF}$ and $Q_h$ transistors provide a reduced dependence on beta. This is explained by referring to FIG. 3. As shown, transistor $Q_h$ supplies the base currents of $Q_{REF}$ and/or $Q_0$. The sum of the base currents is then divided by $(\beta+1)$ of $Q_h$, resulting in a much smaller current that has to be supplied by $I_{REF}$. Detailed analysis, shown on the circuit diagram, is based on the assumption that $Q_{REF}$ and $Q_0$ are matched and, thus, have equal emitter currents, $I_E$. In FIG. 3, a node equation at the node labeled x give $$I_{REF} = \left[\frac{\beta}{\beta+1} + \frac{2}{(\beta+1)^2}\right] I_E$$

Since $$I_0 = \frac{\beta}{\beta+1} I_E$$

it follows that the current gain of this mirror is given by $$\frac{I_0}{I_{REF}} = \frac{1}{1 + 2/(\beta^2 + \beta)}$$
$$\cong \frac{1}{1 + 2/\beta^2}$$

which means that the error due to finite $\beta$ has been reduced from $2/\beta$ to $2/\beta^2$ a tremendous improvement. A similar result is achieved with a NMOS transistor replacing $Q_h$.

Figure 2:
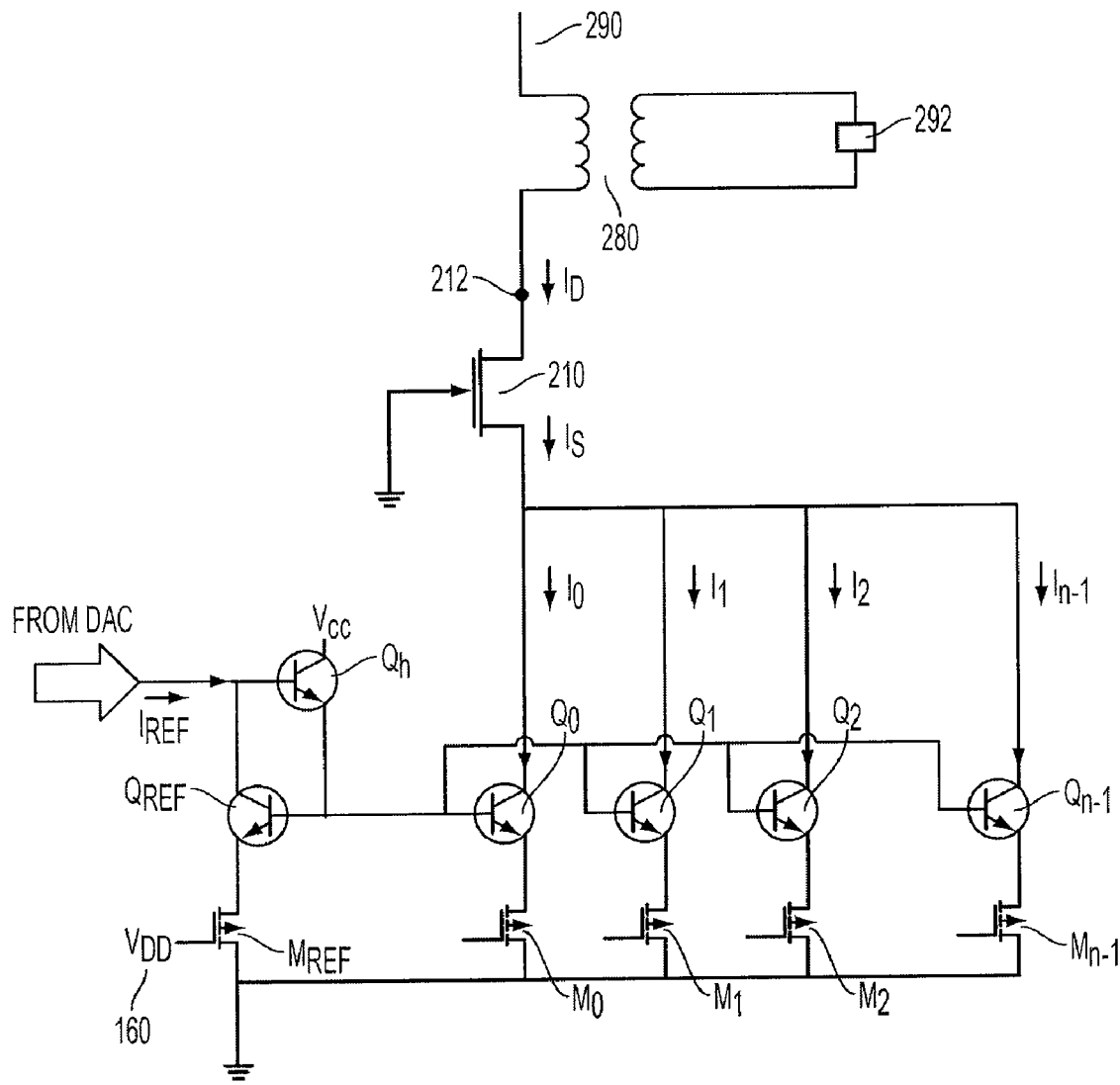
FIG. 2 is a schematic diagram of a direct digital-to-antenna (DDA) radio frequency transmitter, in accordance with an embodiment of the present invention.
Figure 2:
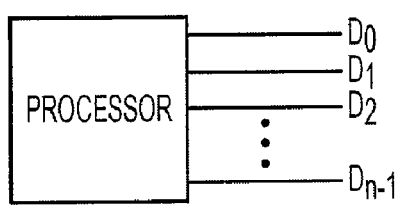

Referring now to FIG. 2, there is illustrated another embodiment of the present invention. The circuit shown in FIG. 2 is configured in a similar manner to the circuit shown in FIG. 1, except that drain 212 of the GaN transistor is connected to the primary winding of matching transformer 280. Another end of the primary winding is connected to a voltage supply, which may include an envelope tracking supply. It will be appreciated that the secondary winding of the matching transformer may be connected to load 290, which may include an antenna.

The core waveform, which may be transmitted by load 292, is outputted by the present invention from drain terminal 212 of GaN transistor 210, and may be formed by the n-bit word having the sequence of digital inputs $D_0$ through $D_{n-1}$, as explained with respect to FIG. 1. Furthermore, the core waveform may be scaled by the $I_{REF}$ signal, which may be outputted from a controller or processor (not shown) by way of a digital to analog converter. It will be understood the changes in the scaling factor of the $I_{REF}$ signal is typically much slower than changes in the core waveform.

Figure 4:
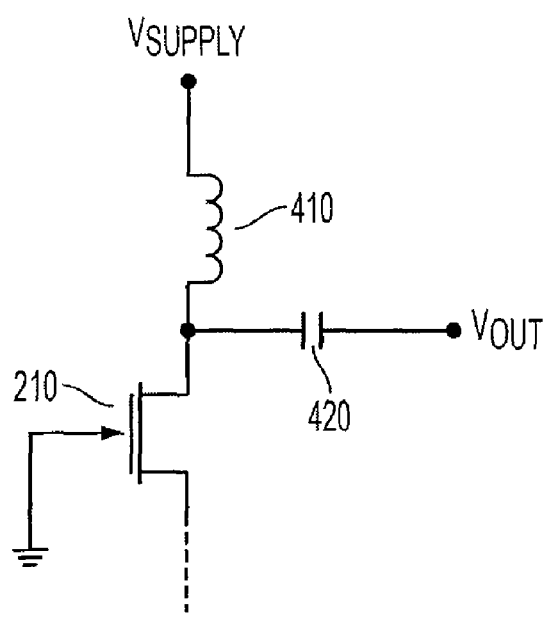
FIG. 4 is a schematic diagram of a load connected to the gallium nitride transistor shown in FIG. 1, in accordance with an embodiment of the present invention.

In a another embodiment, shown in FIG. 4, the matching transformer shown in FIG. 2, may be replaced by an RF choke and a coupling capacitor, respectively, designated as 410 and 420. One end of the RF choke is shown connected to the drain terminal of GaN transistor 210 and the other end of the RF choke is connected to a power supply. The coupling capacitor may be used to provide the core waveform as an output signal.

In yet another embodiment, the matching transformer shown in FIG. 2, may be replaced by an impedance matching network.

In applications where efficiency is important, for example in cell phone communication, the GaN supply voltage may be formed by envelope tracking techniques generated by envelope tracking supply 290. The envelope tracking supply is becoming popular in power amplifier applications and may readily be applicable to the present invention.

Since the circuit in FIG. 1 is in concept a multiplying DAC, the reference current $I_{REF}$ may be generated by a current mode DAC, thereby enabling direct digital waveform amplitude modulation. The output core waveform at the drain of the GaN transistor, therefore, becomes a multiplication of the core waveform digital word times (×) the amplitude control digital word.

The advantages of the present invention in providing direct digital RF waveform synthesis at an antenna for communication and radar applications are many. The present invention allows for a total elimination of the entire RF signal generation and power amplification chain, thereby resulting in a digital-friendly solution, smaller transmitter size and the realization of a truly software defined radio transmitter.

Finally, it should be appreciated that the SiGe bipolar transistors may be replaced with conventional silicon bipolar or NMOS transistors in many applications. The SiGe bipolar transistor is used as an example throughout this application because it affords a higher speed as needed for certain applications. Furthermore, although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A high power digital to analog converter comprising
an array of n transistors arranged in a binary sequence, in which any transistor in the sequence is twice as large as its preceding transistor,
the array of n transistors including respective collector terminals tied together,
a depletion mode field-effect transistor (FET) including a source terminal connected to the respective collector terminals, and a drain terminal for providing a drain current, and
an array of n switches for selectively activating the n transistors of the array, and selectively providing binary weighted collector currents in the respective collector terminals,
wherein the drain current is an approximate sum of the binary weighted collector currents.

2. The high power digital to analog converter of claim 1 wherein
the depletion mode FET includes a gate terminal connected to a ground potential, and
the array of n transistors includes respective emitter terminals connected to the array of n switches for selectively connecting the respective emitter terminals to the ground potential.

3. The high power digital to analog converter of claim 1 wherein
the array of n switches are controlled by a digital word of n bits.

4. The high power digital to analog converter of claim 1 wherein
the depletion mode FET includes a gallium nitride, high electron mobility transistor.

5. The high power digital to analog converter of claim 1 wherein
the array of n switches includes an array of n-channel metal-oxide-semiconductor (NMOS) transistors, and
the array of n transistors includes an array of bipolar transistors or NMOS transistors.

6. The high power digital to analog converter of claim 1 wherein
the array of n switches are controlled, respectively, by n bits, and
the drain current provides an analog signal corresponding to the n bits.

7. The high power digital to analog converter of claim 6 including
a load coupled to the drain terminal for transmitting the analog signal as an RF power output signal.

8. The high power digital to analog converter of claim 7 wherein
the load is a matching transformer including a primary coil coupled to the drain terminal and a secondary coil coupled to an antenna.

9. The high power digital to analog converter of claim 6 including
a processor for providing the n bits as a core waveform to the n switches.

10. The high power digital to analog converter of claim 1 wherein
the array of n transistors includes respective base terminals tied together, and
a reference transistor having a base terminal tied to the respective base terminals of the array of n transistors for establishing a reference current to amplitude modulate the drain current.

11. A direct digital to antenna (DDA) transmitter comprising
an array of n transistors having n collector terminals for providing respective n collector currents, wherein the n collector currents are arranged in a binary sequence of $I_0, I_1, I_2, \ldots I_{n-1}$, and
a depletion mode field-effect transistor (FET) including a source terminal connected to the n collector terminals, and a drain terminal connected to a load for transmitting an analog signal,
wherein the array of n transistors are selectively activated by digital data to provide a selective binary sequence of $I_0, I_1, I_2, \ldots I_{n-1}$, and
the analog signal includes a value that is a predetermined constant value times an approximate sum of the selective binary sequence of $I_0, I_1, I_2, \ldots I_{n-1}$.

12. The DDA transmitter of claim 11 including
an array of n switches for receiving n bits of the digital data and selectively activating at least a portion of the n transistors in the array.

13. The DDA transmitter of claim 11 wherein
the depletion mode FET includes a base terminal connected to a ground potential, and
the array of n transistors includes n emitter terminals coupled to the ground potential.

14. The DDA transmitter of claim 13 wherein
an array of n switches are coupled between the n emitter terminals and the ground potential for selectively activating at least one of the n transistors in the array.

15. The DDA transmitter of claim 11 including
the array of n transistors includes respective base terminals tied together, and
a reference transistor having a base terminal is tied to the respective n base terminals of the array of n transistors for establishing a reference current to amplitude modulate the analog signal.

16. The DDA transmitter of claim 11 wherein
the depletion mode FET includes a gallium nitride, high electron mobility transistor.

17. The DDA transmitter of claim 11 wherein
the array of n switches includes an array of n-channel metal-oxide-semiconductors (NMOS) transistors, and
the array of n transistors includes an array of bipolar transistors or NMOS transistors.

18. The DDA transmitter of claim 11 wherein
the load coupled to the drain terminal is a matching transformer including a primary coil coupled to the drain terminal and a secondary coil configured for coupling to an antenna.

19. The DDA transmitter of claim 11 wherein
the load coupled to the drain terminal is configured for connection to a voltage supply, and
the array of n transistors have a breakdown voltage that is lower than a voltage provided by the voltage supply.

20. The DDA transmitter of claim 11 wherein
the array of n transistors are coupled to another array of n switches for selectively providing the digital data.

* * * * *